United States Patent
Barratt et al.

(10) Patent No.: US 6,384,433 B1
(45) Date of Patent: May 7, 2002

(54) VOLTAGE VARIABLE RESISTOR FROM HBT EPITAXIAL LAYERS

(75) Inventors: Curtis A. Barratt; Arthur E. Geissberger, both of Greensboro; Larry W. Kapitan, Summerfield; Michael T. Fresina; Ramond Jeffrey Vass, both of Greensboro, all of NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 09/533,138

(22) Filed: Mar. 23, 2000

(51) Int. Cl.⁷ .......................................... H01L 31/0328
(52) U.S. Cl. .................... 257/197; 257/526; 257/552; 257/557; 257/560; 257/590; 257/536; 257/537; 257/538; 438/235; 438/236; 438/237; 438/327; 438/328; 438/331
(58) Field of Search ...................... 257/47, 197, 526, 257/552, 557, 560, 592, 536–538; 438/235, 236, 237, 327, 328, 331, 343

(56) References Cited

U.S. PATENT DOCUMENTS

| | | | |
|---|---|---|---|
| 5,070,383 A | * 12/1991 | Sinar et al. | 357/51 |
| 5,250,826 A | * 10/1993 | Chang et al. | 257/273 |
| 5,566,044 A | 10/1996 | Bergemont et al. | 361/321.1 |
| 5,694,069 A | 12/1997 | Kasashima et al. | 327/179 |
| 5,731,625 A | 3/1998 | Chen | 257/565 |
| 5,889,296 A | * 3/1999 | Imamura et al. | 257/184 |
| 6,043,519 A | * 3/2000 | Shealy et al. | 257/195 |

* cited by examiner

Primary Examiner—Douglas Will
Assistant Examiner—Wai-Sing Louie
(74) Attorney, Agent, or Firm—Withrow & Terranova, P.L.L.C.

(57) ABSTRACT

A voltage variable resistor formed on heterojunction bipolar transistor epitaxial material includes a current channel made on emitter material. Emitter mesas separated by a recess provide the contacts for the voltage variable resistor. Each mesa is topped with emitter metal forming the resistor contacts. The emitter mesas are layered on top of the current channel that is layered atop of a base layer. The voltage variable resistor's control contact is provided by a base contact located on the base layer and separated from the current channel.

19 Claims, 2 Drawing Sheets

VOLTAGE VARIABLE RESISTOR FROM HBT EPITAXIAL LAYERS

BACKGROUND OF THE INVENTION

1. Field of the Invention

This invention relates in general to the field of semiconductor devices, and in particular, to a voltage variable resistor formulated from HBT epitaxial layers.

2. Description of the Prior Art

Power amplifier devices are typically designed to achieve a fairly linear response of gain or power versus regulated supply voltage (Vreg) over their operating design range. This is an especially desirable feature in battery operated radio communication devices such as cellular telephones which have to operate in an environment in which the supply (battery) voltage is constantly changing. Using voltage variable resistors in the design as is known in the art can effect automatic adjustment of the power amplifier gain and or power characteristics with respect to changes in Vreg. The control voltage used to adjust the resistance of the voltage variable resistor in a typical radio application could be a voltage derived from an automatic gain control circuit or some other circuit as is known in the art.

It would be beneficial if the voltage variable resistor could be integrated into the power amplifier's semiconductor design and take up minimum surface area. Such integration is especially desirable if the voltage variable resistor is to be manufactured on heterojunction bipolar transistor (HBT) epitaxial material as are some power amplifier integrated circuits. As such, a need exists in the art for a voltage variable resistor that is manufactured on HBT epitaxial material and that is manufactured in conjunction with an HBT on the same III–V semiconductor chip.

Layered epitaxial structures providing HBTs and FETs on the same semiconductor substrate are known. U.S. Pat. No. 5,250,826, issued Oct. 5, 1993, to Chang et al., entitled PLANAR HBT-FET DEVICE, discloses a III–V compound planar HBT-FET device integrating FETs with HBTs formed on the same semiconductor substrate. Although it is known that FET structures are configurable to provide a transferred or controlled resistance under certain operating conditions, the '826 patent does not disclose using an FET or other like device as a voltage controlled resistor, but instead focuses on using an FET as a traditional transistor for amplifying and switching applications. Further, the '826 patent discloses a FET structure having a Schottky gate metal contact deposited on the emitter cap layer for providing a control voltage to the FET.

SUMMARY OF THE INVENTION

The present invention is directed to a voltage controlled resistance device such as a voltage controlled resistor, manufactured on HBT epitaxial material in conjunction with an HBT on the same III–V semiconductor chip. Preferably, the device can exert control over the range of 0–3.0 volts, which is the supply voltage range present in most modern battery operated devices. The device can be made with no modification to the epitaxial layers required to make AlGaAs/GaAs HBT devices; and it can be made without the necessity of a Schottky gate electrode such as required for the HBT-FET device disclosed and claimed in U.S. Pat. No. 5,250,826, discussed above. One embodiment of the invention comprises a heavily doped base layer of P-type GaAs; a lightly doped emitter layer of N-type AlGaAs deposited atop a portion of the base layer; first and second emitter mesas formed from a heavily doped emitter contact layer of N-type GaAs deposited atop the emitter layer; a heavily doped emitter cap layer of N-type InGaAs deposited atop the emitter contact layer, wherein the first and second emitter mesas are separated by a recess; emitter metal contacts deposited atop the emitter cap layer atop the first and second emitter mesas; and a base metal contact deposited atop the base layer, wherein the base metal contact is separated from the emitter layer. The recess is disposed through the InGaAs cap layer and GaAs contact layer via etchant formulations that are chemically selective to the AlGaAs emitter layer. Such selective formulations are very well known in the industry.

Accordingly, a feature of the present invention includes provision of a voltage variable resistor formulated from HBT expitaxial layers with no modification to the epitaxial structure generally associated with NPN HBT devices.

Another feature of the present invention includes provision of a voltage variable resistor via a chemical etchant that increases the manufacturing margin associated with like HBT devices.

Still another feature of the present invention includes provision of a voltage variable resistor that controls a resistance level via an electrode voltage very much like a field effect transistor, but without use of a Schottky gate electrode.

Yet another feature of the present invention includes provision of a voltage variable resistor that can be formulated with no more than two additional manufacturing operations beyond those necessary to fabricate an HBT amplifier.

Yet another feature of the present invention includes provision of a voltage variable resistor formulated from HBT epitaxial layers and having a control voltage range between 0 and about 3.0 volts dc.

These and other features of the present invention will become apparent to those skilled in the art after reading of the following description of the preferred embodiment when considered with the drawings.

DETAILED DESCRIPTION OF THE PREFERRED EMBODIMENTS

Figure 1:
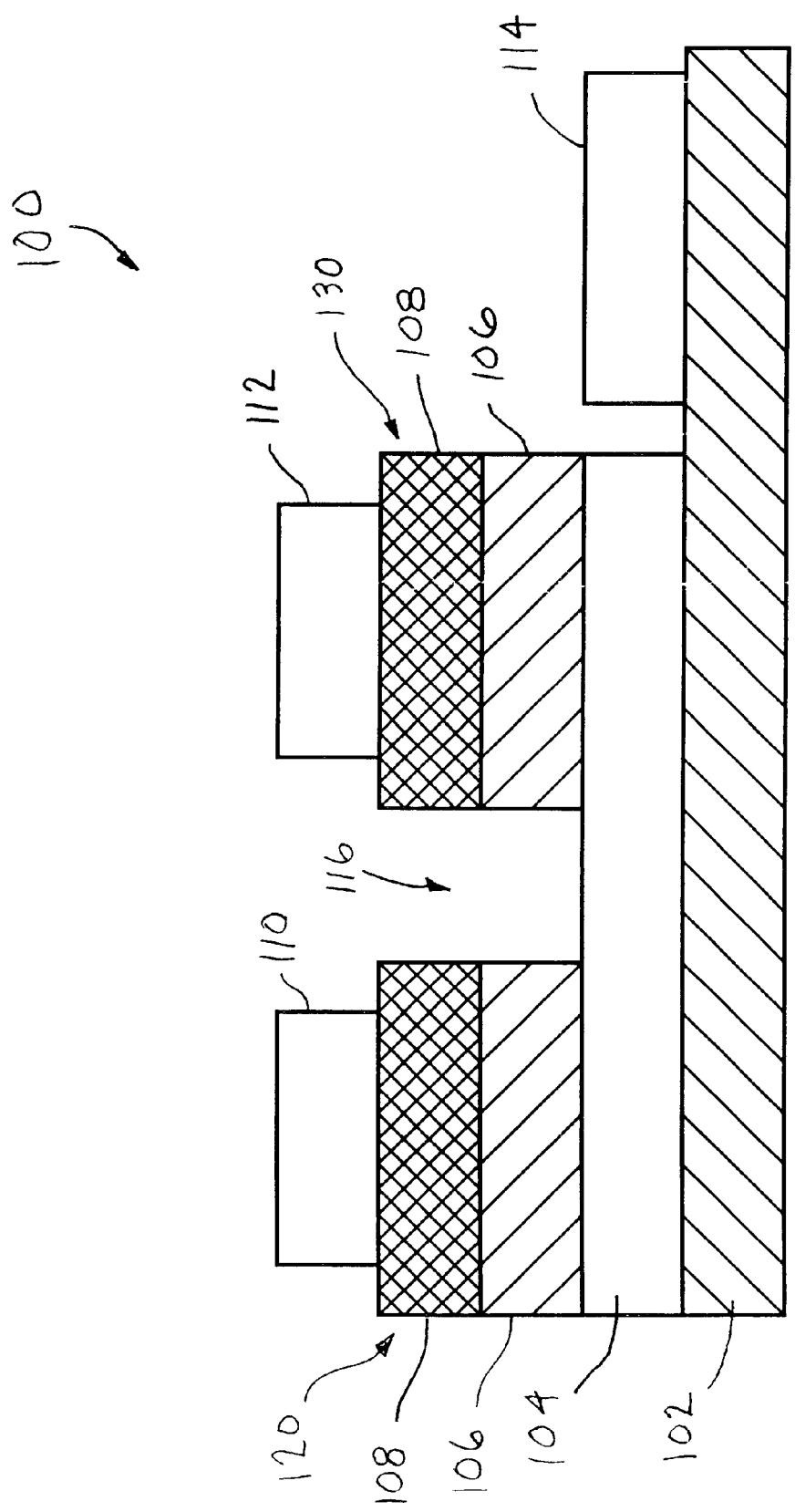
FIG. 1 is an elevational view illustrating a partial cross section of a voltage variable resistor in accordance with one embodiment of the present invention.

Referring to FIG. 1, there is shown a voltage variable resistor (VVR) 100 in accordance with one embodiment of the present invention. Resistor 100 controls its channel resistance with a controlled electrode voltage as will be explained further below. The VVR 100 includes a channel 104, made on heterojunction bipolar transistor (HBT) emitter material, that is preferably comprised of lightly doped N-type Aluminum Gallium Arsenide (AlGaAs). The VVR 100 resistance characteristics are controlled via reverse biasing of the emitter base junction. The VVR 100 according to one embodiment of the present invention comprises a planar device manufactured from III–V semiconductor materials using conventional deposition, masking, and etching steps.

The base layer 102 of the VVR 100 is preferably comprised of heavily doped P-type Gallium Arsenide (GaAs)

base material. As stated above, the channel 104 for the voltage variable resistor 104 is made on the emitter material, which is preferably lightly doped N-type Aluminum Gallium Arsenide (AlGaAs). The VVR 100 includes emitter mesas 120, 130 that are formed using Indium Gallium Arsenide (InGaAs) emitter caps 108 and Gallium Arsenide (GaAs) emitter contact layers 106, that are deposited over the AlGaAs emitter material forming the channel 104. Each of the two mesas 120, 130 are topped with emitter metal 110 and 112 which form the two resistance ports or contacts for the voltage variable resistor 100. A control contact 114 is formed using base metal that is separated from the channel 104.

Figure 2:
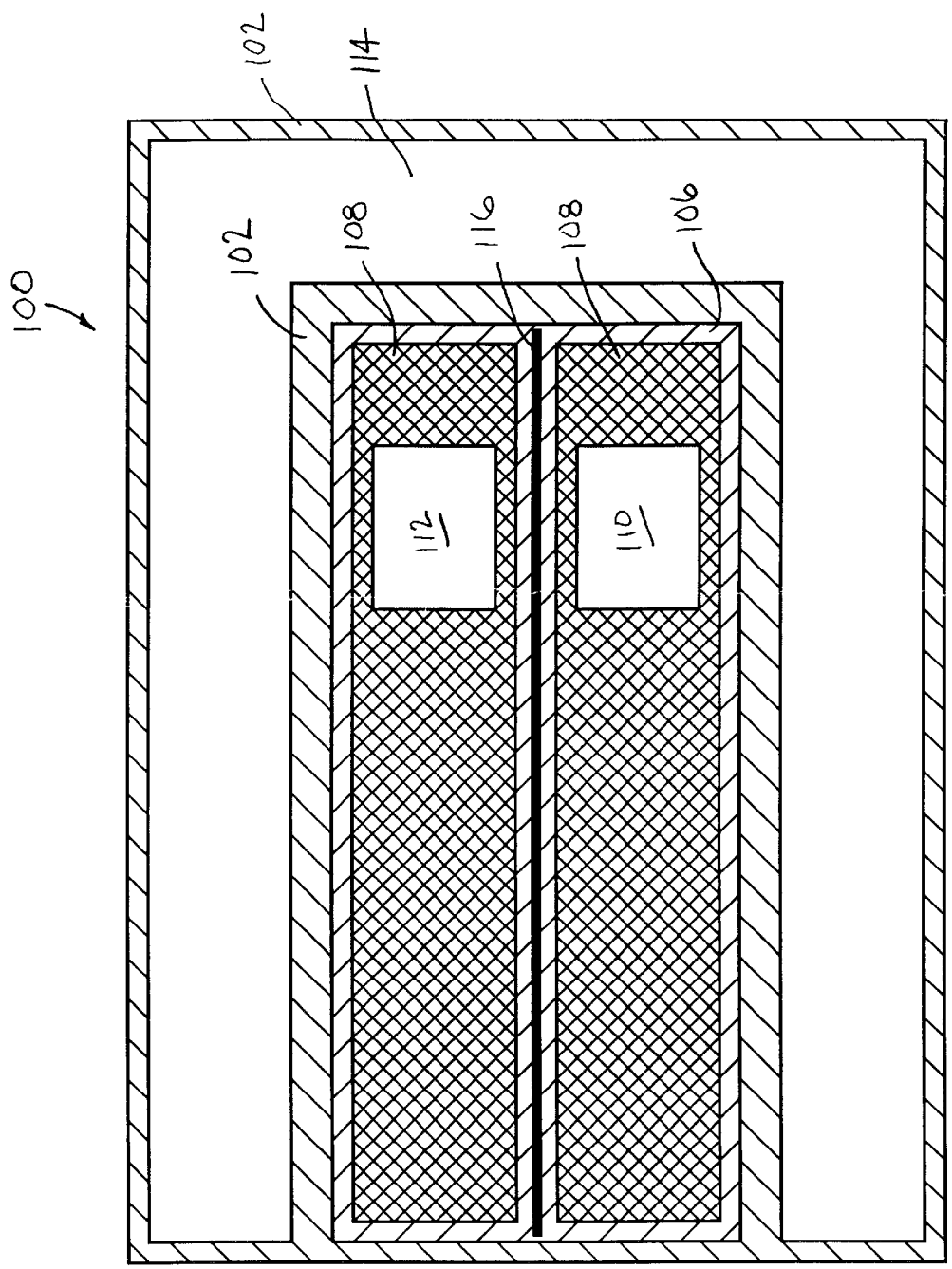
FIG. 2 shows a top view of the voltage variable resistor depicted in FIG. 1.

A top view of the voltage variable resistor 100 illustrated in FIG. 1 is shown in FIG. 2. Since the InGaAs cap layer 108 and the GaAs contact layer 106 are N+, it will not be possible to fully deplete the emitter channel 104 of charge prior to reverse avalanche breakdown of the emitter base junction. This limitation can be removed by etching a recess 116 into the emitter layers 106, 108 to formulate a channel 104 that can be "pinched off" such that the voltage variable resistor 100 can attain a resistance value of >10 KΩ. There are many methods known in the art on how to selectively wet etch GaAs over AlGaAs. The present invention uses one of these known wet etching techniques for creating a recess 116 in a strip of emitter mesa stopping at the AlGaAs emitter channel layer 104. Epitaxial growth and the selectivity of the etch assures the reproducibility of the channel 104 defining the voltage variable resistor 100.

Effective resistance of the voltage variable resistor 100 will depend on the recess 116 dimensions, emitter cap layer 108, contact layer 106 and emitter channel 104 materials, amount of doping and, the control voltage applied to the voltage variable resistor 100. During use, the voltage applied to the base contact 114 is negative with respect to either or both of the resistor 100 contacts 110 and 112. This may mean taking the base contact 114 to ground and providing a positive voltage on the resistor contacts 110, 112.

The AlGaAs channel 104, in one embodiment, will be about 1 KΩ/sq. Using a one micron stripe for etching yields a recess about 1.2 microns wide. This translates to a resistance value of 1.2 Ω at 0 bias. The width of the VVR 100 can be figured by dividing this number by the desired resistance for a given resistance value. A 50 Ω resistor, for example, has a width of approximately 24 microns. A 50 Ω VVR 100 would then be about the size of a 2×20 Ω. The resistance of the VVR 100 will not vary linearly with the control voltage applied to the VVR 100, but will vary similar to a field effect transistor $G_m$ versus Vgs.

While the invention has been described in conjunction with specific embodiments, many alternatives and variations will become apparent to those skilled in the art in light of the foregoing description.

What is claimed is:

1. A voltage variable resistor, comprising:
   a base layer of semiconductor material;
   an emitter layer of semiconductor material deposited atop a portion of the base layer;
   first and second emitter mesas formed from an emitter contact layer of semiconductor material deposited atop the emitter layer, and an emitter cap layer of semiconductor material deposited atop the emitter contact layer, wherein the first and second emitter mesas are separated by a recess and connected to one another via the emitter layer;
   emitter metal contacts deposited atop the emitter cap layer atop the first and second emitter mesas; and
   a base metal contact deposited atop the base layer, wherein the base metal contact is separated from the emitter layer.

2. The voltage variable resistor according to claim 1, wherein the base layer comprises a heavily doped semiconductor material of a first conductivity type.

3. The voltage variable resistor according to claim 1, wherein the emitter layer comprises a lightly doped semiconductor material of a conductivity type different from the first conductivity type.

4. The voltage variable resistor according to claim 1, wherein the base metal contact is configured to provide a control terminal for the voltage variable resistor.

5. The voltage variable resistor according to claim 1, wherein the recess is capable of being formed by a wet etching process.

6. The voltage variable resistor according to claim 5, wherein the recess has a bottom portion comprised of a top portion of the emitter layer.

7. The voltage variable resistor according to claim 1, wherein both the emitter cap layer and emitter contact layer comprise heavily doped semiconductor material.

8. A voltage variable resistor, comprising:
   a base layer of heavily doped semiconductor material of a first conductivity type;
   an emitter layer of semiconductor material of a second conductivity type deposited atop a portion of the base layer;
   an emitter contact layer of semiconductor material deposited atop the emitter layer;
   an emitter cap layer of semiconductor material deposited atop the contact layer;
   a recess disposed through the emitter contact layer and the emitter cap layer forming first and second emitter mesas, which are connected to one another via the emitter layer;
   emitter metal deposited atop the first and second emitter mesas; and
   a base metal deposited atop the base layer and separated from the emitter layer.

9. The voltage variable resistor according to claim 8, wherein the emitter layer comprises lightly doped semiconductor material configured as a current channel for the voltage variable resistor.

10. The voltage variable resistor according to claim 8, wherein the recess is capable of being formed via a wet etching process.

11. The voltage variable resistor according to claim 8, wherein the base and emitter layers comprise epitaxial material.

12. The voltage variable resistor according to claim 8, wherein the base layer comprises Gallium Arsenide and the emitter layer comprises Aluminum Gallium Arsenide.

13. A voltage variable resistor, comprising:
   a base layer of heavily doped P-type Gallium Arsenide;
   an emitter layer of lightly doped N-type Aluminum Gallium Arsenide deposited atop a portion of the base layer;
   an emitter contact layer of heavily doped N-type Gallium Arsenide deposited atop the emitter layer;
   an emitter cap layer of heavily doped N-type Indium Gallium Arsenide deposited atop the contact layer;
   a recess disposed through the emitter contact layer and the emitter cap layer forming first and second emitter mesas;

emitter metal deposited atop the first and second emitter mesas, which are connected to one another via the emitter layer; and a base metal deposited atop the base layer and separated from the emitter layer.

14. The voltage variable resistor according to claim 13 wherein the recess has a bottom portion comprising a top portion of the emitter layer.

15. The voltage variable resistor according to claim 14 wherein the recess has dimensions permitting the emitter layer to be substantially depleted in less than about 2.5 volts dc.

16. The voltage variable resistor according to claim 14 wherein the recess has dimensions permitting the emitter layer to substantially pinched off such that the voltage variable resistor can attain a value greater than about 10 KΩ.

17. The voltage variable resistor of claim 1 wherein the base metal contact is outside of the recess between the first and second emitter mesas.

18. The voltage variable resistor of claim 8 wherein the base metal is outside of the recess between the first and second emitter mesas.

19. The voltage variable resistor of claim 13 wherein the base metal is outside of the recess between the first and second emitter mesas.

* * * * *